(12) United States Patent
Takayanagi et al.

(10) Patent No.: US 8,375,887 B2
(45) Date of Patent: Feb. 19, 2013

(54) SOLUTION TREATMENT APPARATUS, SOLUTION TREATMENT METHOD AND RESIST COATING METHOD

(75) Inventors: Koji Takayanagi, Koshi (JP); Naofumi Kishita, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 286 days.

(21) Appl. No.: 12/656,997

(22) Filed: Feb. 23, 2010

(65) Prior Publication Data

US 2010/0227056 A1 Sep. 9, 2010

(30) Foreign Application Priority Data

Mar. 4, 2009 (JP) .................... 2009-051174

(51) Int. Cl.
*B05B 1/28* (2006.01)
*B05C 11/02* (2006.01)
*B05C 5/00* (2006.01)

(52) U.S. Cl. .......... 118/326; 118/52; 118/612; 118/319; 118/320

(58) Field of Classification Search .............. 118/52, 118/612, 56, 326, 319, 320; 396/604, 611, 396/627; 427/240; 134/153, 198, 902
See application file for complete search history.

(56) References Cited

U.S. PATENT DOCUMENTS

| | | | |
|---|---|---|---|
| 6,533,864 B1 * | 3/2003 | Matsuyama et al. | 118/704 |
| 6,572,701 B2 * | 6/2003 | Yamauchi et al. | 118/52 |
| 7,048,800 B2 * | 5/2006 | Nguyen | 118/501 |
| 2005/0284362 A1 * | 12/2005 | Kim et al. | 118/52 |

FOREIGN PATENT DOCUMENTS

| | | |
|---|---|---|
| JP | A-S59-127836 | 7/1984 |
| JP | A-02-009476 | 1/1990 |
| JP | A-07-106233 | 4/1995 |
| JP | A-2003-174010 | 6/2003 |
| JP | A-2005-175079 | 6/2005 |
| JP | A-2007-165869 | 6/2007 |
| JP | A-2007-194503 | 8/2007 |
| JP | A-2007-220989 | 8/2007 |
| JP | A-2008-277708 | 11/2008 |

OTHER PUBLICATIONS

Office Action mailed on Apr. 19, 2011 issued from the Japanese Patent Office in the corresponding Japanese patent application No. 2009-061657 (English Translation enclosed).
Office Action mailed on Apr. 19, 2011 issued from the Japanese Patent Office in the corresponding Japanese patent application No. 2009-051174 (English Translation enclosed).

* cited by examiner

*Primary Examiner* — Yewebdar Tadesse
(74) *Attorney, Agent, or Firm* — Posz Law Group, PLC

(57) ABSTRACT

The invention includes a lower guide unit which obliquely extends downward to an outside from a position closely opposed to a peripheral edge portion of a rear surface of the substrate held on the substrate holding unit, and is formed in an annular shape in a circumferential direction of the substrate; and an upper guide unit which has an upper end surface located at a substantially same height as a front surface of the substrate held on the substrate holding unit, forms a lower annular flow path between the upper guide unit and the lower guide unit for guiding downward together with a gas flow a treatment solution scattering from the substrate, is formed in an annular shape opposed to the lower guide unit to surround an outside lower region of the substrate, and has an inner peripheral surface having a longitudinal-sectional shape curved to bulge outward and extending downward.

4 Claims, 19 Drawing Sheets

SOLUTION TREATMENT APPARATUS, SOLUTION TREATMENT METHOD AND RESIST COATING METHOD

BACKGROUND OF THE INVENTION

1. Field of the Invention

The present invention relates to a solution treatment apparatus, a solution treatment method and a resist coating method, each holding a substrate such as a semiconductor wafer or the like on a substrate holding unit provided in a treatment cup, and performing solution treatment by supplying a treatment solution from a nozzle to the substrate and rotating the substrate.

2. Description of the Related Art

In a photolithography process on a semiconductor wafer (hereinafter, referred to as a "wafer"), resist coating treatment of forming a resist film on the front surface of the wafer is performed, and methods of the coating treatment includes, for example, a spin-coating method. In a resist coating apparatus employing the spin coating method has, for example, a spin chuck 11 holding the wafer W by suction, a rotation drive unit 12 rotating the spin chuck 11, a resist nozzle 15 supplying a resist solution to the wafer W, and a treatment cup 20 which surrounds the spin chuck 11 and has a waste solution path 13 and an exhaust pipe 14 connected to its lower portion, as shown in FIG. 17.

Further, in the treatment cup 20, an annular lower guide unit 21 inclined downward to the outside from below a peripheral edge portion of the wafer W, an annular upper guide unit 22 obliquely downward from near the peripheral edge of the wafer W with a gap therebetween, and an annular outer guide unit 23 above the upper guide unit 22, are provided. A gap between the lower guide unit 21 and the upper guide unit 22 forms an annular flow path 24. As shown in FIG. 17 and FIG. 18, the upper guide unit 22 has a plurality of openings 25 formed along a circumferential direction. The openings 25 allow a space surrounded by the outer guide unit 23 and the upper guide unit 22 to communicate with the annular flow path 24.

The exhaust pipe 14 is connected to a plant exhaust (an exhaust system including an exhaust path provided in a plant) via a damper 14a on the upstream side. The exhaust pipe 14 can exhaust an atmosphere in the treatment cup 20 at an exhaust rate at one of two stages such as a high exhaust (a state in which the exhaust pressure is high and the exhaust rate is high) and a low exhaust (a state in which the exhaust pressure is low and the exhaust rate is low), by the degree of opening/closing of the damper 14a. The high exhaust is set for a purpose of collecting mist at the time of discharging the resist solution, and the low exhaust is set for a purpose of collecting mist at the time of drying the resist. The reason why gas is exhausted at the low exhaust at the time of drying the resist is that exhaust of gas at the high exhaust can adversely affect the uniformity in film thickness.

Next, a resist coating process using the resist coating apparatus will be briefly described. In the resist coating apparatus, a downflow is formed by a fan filter unit (FFU) 17. In the resist coating apparatus, for example, the resist solution is applied from a resist nozzle 15 to a center of the rotating wafer W, and spin drying is then performed. In this process, a part of the resist solution scattered from the wafer W flows under its own weight down the lower guide unit 21, and is exhausted to the outside from the waste solution path 13. Besides, the resist become mist rides on a descending gas flow flowing through the openings 25 and a gas flow generated by the rotating the wafer W, through the annular flow path 24 and is sucked and exhausted from the exhaust pipe 14.

Incidentally, by supplying a solvent being a cleaning solution to a rear surface side of the wafer W while rotating the wafer W, a so-called rear surface cleaning has been performed conventionally. When performing the rear surface cleaning, it is requested to remove the resist attached to bevel portions on a front surface side and the rear surface side of the wafer W and accurately control a separation dimension between a peripheral edge of the resist film and a peripheral edge of the wafer W, that is, a cut width of the resist. Therefore, as described in Japanese Patent Application Publication No. 2008-277708, a technique is known in which a cleaning solution (solvent) is discharged to the bevel portion on the rear surface side of the wafer W from a nozzle fitted in an inner guide unit 21 below near the peripheral edge portion of the rear surface of the wafer W. When performing the bevel cleaning, the number of rotations of the wafer W needs to be set, for example, to a high rotation of about 2500 rpm in order to push up the discharged cleaning solution from the bevel portion on the rear surface side to a position slightly inside the peripheral edge on the front surface side of the wafer W through the bevel portion on the front surface side. A bevel cleaning nozzle 26 is fitted in the lower guide unit 21 as shown in FIG. 17. In this bevel cleaning process, the number of rotations of the wafer W is larger than that in the prior art, in order to cause the cleaning solution to reach the peripheral edge potion on the front surface of the wafer W.

On the other hand, the number of treatment cups 20 installed in a semiconductor manufacturing apparatus is increased with an improvement in production efficiency and thereby the total exhaust amount of the gas exhausted from a plurality of treatment cups 20 increases recently. Consequently, the plant power usage is pressed, and there is a concern that the increase adversely affects the environment. Further, in the resist coating apparatus, it is difficult to make the above-described exhaust system at two stages or more (for example, three stages such as a high exhaust, an intermediate exhaust, and a low exhaust) because of complication in control of the exhaust system. Therefore, it is forced to collect scattered resist mist by exhausting gas at the high exhaust at the time of discharging the resist solution and exhaust gas at the low exhaust in order to restrain the increase in exhaust rate except the time when discharging the resist solution (including the time of bevel cleaning).

Accordingly, in the bevel cleaning process, the number of rotations of the wafer W is increased, the flow speed of a gas flow generated by the rotation of the wafer W increases, and the exhaust rate from the treatment cup 20 is set to the low exhaust, whereby the air amount taken into the annular flow path 24 will exceed the exhaust capacity. However, a space of a vertical portion of the annular flow path 24 is set to be narrow in order to uniformly exhaust gas in a circumferential direction. For this reason, a part of the gas flow flowed into an inclined portion of the annular flow path 24 reversely flows upward from below through the above-described openings 25 as so-called excessive air as shown in FIG. 19, and flows to the outside from an opening of the treatment cup 20. In this event, the mist of the cleaning solution discharged from a discharge port 26a of the bevel cleaning nozzle 26 scatters to the outside of the treatment cup 20. As a result, the mist of the cleaning solution rides on the descending gas flow and reattaches to the front surface of the wafer W, and the attached portion causes a pattern defect. Further, since an outer edge of the wafer W and the upper guide unit 22 are close to each other in distance, the resist solution and the cleaning solution spun off from the wafer W can bump into an inner side wall of the upper guide unit 22 and bounce to the front surface of the wafer W and attach thereto.

In Japanese Patent Application Publication No. S59-127836, a resist coating apparatus is disclosed which has cylindrical shielding plates extending from an upper surface and a bottom surface of the treatment cup respectively to near an outer periphery of a wafer held on a spin chuck. However, the cylindrical shielding plates are provided essentially for the purpose of preventing bounce of the coating solution scattered from the rotating wafer, and therefore it is difficult to solve the problem of mist scattering to the outside of the treatment cup due to reverse flow of the above-described gas flow.

SUMMARY OF THE INVENTION

The present invention has been made in consideration of the above circumstances, and an object thereof is to provide a solution treatment apparatus and a solution treatment method capable of restraining a reverse flow of an exhaust gas flow to reduce mist reattaching to the substrate even when the number of rotations of the substrate is increased and gas in the treatment cup is exhausted at a low exhaust rate in supplying a treatment solution to the substrate while rotating the substrate to treat the substrate.

The solution treatment apparatus according to the present invention is a solution treatment apparatus performing solution treatment on a substrate while rotating the substrate held on a substrate holding unit in a treatment cup in which a descending gas flow is formed, and sucking and exhausting an atmosphere in the treatment cup and draining a solution in the treatment cup, from a lower portion of the treatment cup, the apparatus including:

a nozzle for supplying a treatment solution to the substrate held on the substrate holding unit;

a lower guide unit which obliquely extends downward to an outside from a position closely opposed to a peripheral edge portion of a rear surface of the substrate held on the substrate holding unit, and is formed in an annular shape in a circumferential direction of the substrate; and an upper guide unit which has an upper end surface located at a substantially same height as a front surface of the substrate held on the substrate holding unit, forms a lower annular flow path between the upper guide unit and the lower guide unit for guiding downward together with a gas flow a treatment solution scattering from the substrate, is formed in an annular shape opposed to the lower guide unit to surround an outside lower region of the substrate, and has an inner peripheral surface having a longitudinal-sectional shape curved to bulge outward and extending downward.

Further, the solution treatment method according to the present invention is a solution treatment method using a solution treatment apparatus performing solution treatment on a substrate while rotating the substrate held on a substrate holding unit in a treatment cup in which a descending gas flow is formed, and sucking and exhausting an atmosphere in the treatment cup and draining a solution in the treatment cup, from a lower portion of the treatment cup, the solution treatment apparatus including:

a nozzle for supplying a treatment solution to the substrate held on the substrate holding unit;

a lower guide unit which obliquely extends downward to an outside from a position closely opposed to a peripheral edge portion of a rear surface of the substrate held on the substrate holding unit, and is formed in an annular shape in a circumferential direction of the substrate; and an upper guide unit which has an upper end surface located at a substantially same height as a front surface of the substrate held on the substrate holding unit, forms a lower annular flow path between the upper guide unit and the lower guide unit for guiding downward together with a gas flow a treatment solution scattering from the substrate, is formed in an annular shape opposed to the lower guide unit to surround an outside lower region of the substrate, and has an inner peripheral surface having a longitudinal-sectional shape curved to bulge outward and extending downward, the solution treatment method including:

supplying a coating solution being the treatment solution from the nozzle to a center portion of the substrate while rotating the substrate to coat the front surface of the substrate; and subsequently, supplying a cleaning solution being the treatment solution to the substrate while rotating the substrate to clean the substrate.

Further, a resist coating method according to the present invention is a resist coating method of applying a resist solution being a treatment solution to a front surface of a substrate, using a solution treatment apparatus performing solution treatment on the substrate while rotating the substrate held on a substrate holding unit in a treatment cup in which a descending gas flow is formed, and sucking and exhausting an atmosphere in the treatment cup and draining a solution in the treatment cup, from a lower portion of the treatment cup, the solution treatment apparatus including:

a nozzle for supplying a treatment solution to the substrate held on the substrate holding unit;

a lower guide unit which obliquely extends downward to an outside from a position closely opposed to a peripheral edge portion of a rear surface of the substrate held on the substrate holding unit, and is formed in an annular shape in a circumferential direction of the substrate;

an upper guide unit which has an upper end surface located at a substantially same height as a front surface of the substrate held on the substrate holding unit, forms a lower annular flow path between the upper guide unit and the lower guide unit for guiding downward together with a gas flow a treatment solution scattering from the substrate, is formed in an annular shape opposed to the lower guide unit to surround an outside lower region of the substrate, and has an inner peripheral surface having a longitudinal-sectional shape curved to bulge outward and extending downward;

an outer guide unit which is provided to be located outside the upper guide unit and surround the upper guide unit, and forms an upper annular flow path between the outer guide unit and the upper guide unit for rectifying a gas flow when the substrate is rotated; and an opening formed in a lower edge portion of the upper guide unit for merging a gas flow passed through the upper annular flow path with a gas flow passed through the lower annular flow path, the resist coating method including:

discharging the resist solution being the treatment solution from a nozzle for resist to a center portion of the substrate, setting an exhaust rate switching mechanism to a first state in which gas is exhausted at a first exhaust rate, and rotating the substrate to apply the resist solution on the front surface of the substrate;

setting the exhaust rate switching mechanism to a second state in which gas is exhausted at a second exhaust rate lower than the first exhaust rate, and rotating the substrate having the resist solution applied on the front surface to dry the resist solution; and discharging a cleaning solution being the treatment solution from a nozzle for cleaning to a bevel portion at a peripheral edge of the rear surface of the substrate, and rotating the substrate with the exhaust rate switching mechanism set at the second state, to clean the substrate.

In the solution treatment apparatus of the present invention, the inner peripheral surface of the upper guide unit is formed to curve to bulge outward and extend downward, for sucking and exhausting a treatment solution scattering from the substrate held on the substrate holding unit, from a lower annular flow path between the upper guide unit and the lower guide unit. Therefore, the flow speed of the gas flow generated by the rotating substrate can be decreased by increasing the volume of the lower annular flow path. Accordingly, it is possible to restrain the gas flow from reversely flowing and mist of the treatment solution from scattering on the gas flow to the outside of the treatment cup and reattaching to the substrate even in a process in which the number of rotations of the substrate is large and gas in the treatment cup is exhausted at a low exhaust.

In other words, the exhaust rate can be reduced even in a solution treatment in which the number of rotations of the substrate is large. When performing the resist coating method using the apparatus of the present invention, the reverse flow of exhaust in the cup can be restrained even by setting the number of rotations of the substrate to large and the exhaust rate to low when cleaning the bevel portion of the substrate, thus making it possible to restrain reattachment of mist to the substrate to reduce the generation of a defect of a pattern. As the exhaust rate needs to be set high at the time of applying a resist, a simple function of switching between two stages such as a high exhaust and a low exhaust can be used, and the exhaust rate at the cleaning of the bevel portion can be reduced.

DETAILED DESCRIPTION OF THE INVENTION

Figure 1:
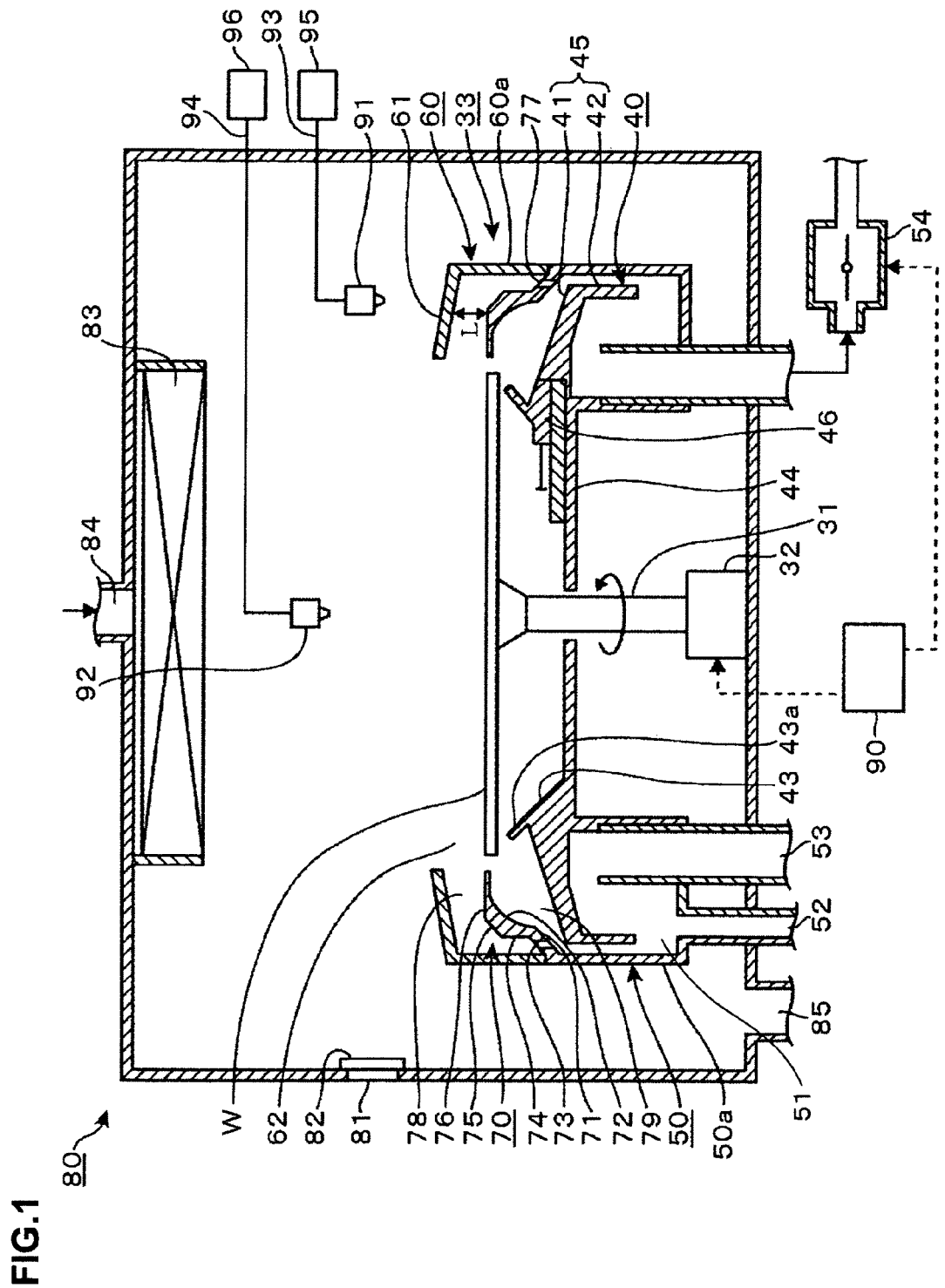
FIG. 1 is a longitudinal sectional view of a resist coating apparatus according to an embodiment of the present invention.

An embodiment in which a solution treatment apparatus according to the present invention is applied to a resist coating apparatus will be described. The resist coating apparatus includes, as shown in FIG. 1, a spin chuck 31 which horizontally holds a wafer W by vacuum suction. The spin chuck 31 can lift up and down and rotate around the vertical axis by means of a rotation drive unit 32 connected thereto from below. A treatment cup 33 is provided to surround the spin chuck 31, and the treatment cup 33 is composed of an inner cup 40, an intermediate cup 50, and an outer cup 60 as an outer guide unit.

Figure 2:
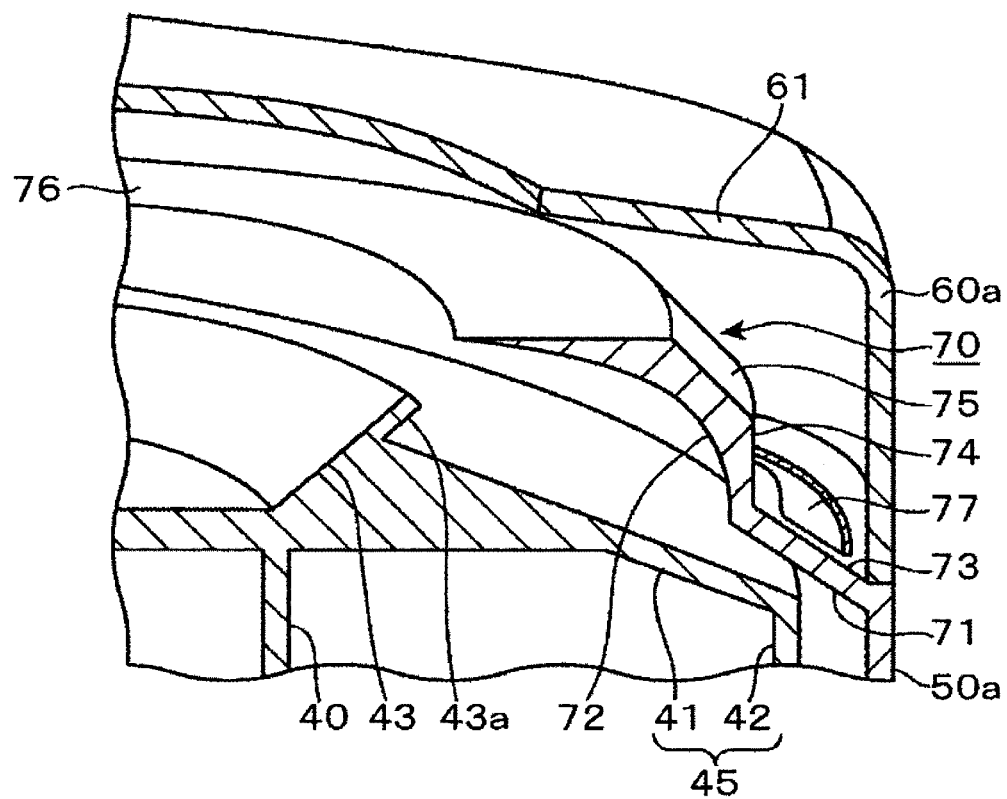
FIG. 2 is a top view of a portion of a treatment cup used in the resist coating apparatus.

As shown in FIGS. 1 and 2, the inner cup 40 is composed of an inclined wall 41 which is inclined downward to the outside from a position below the wafer W held on the spin chuck 31 and closely opposed to a peripheral edge portion on a rear surface side of the wafer W and is annular in the circumferential direction of the wafer W; and an annular vertical wall 42 which continues from a lower edge of the inclined wall 41 and extends downward. The inclined wall 41 and the vertical wall 42 have a function of a lower guide part 45 which guides the resist solution dropped off from the wafer W in flowing down. Further, on the top of the inner cup 40, a protruding wall part 43 is formed in a annular shape which extends obliquely upward from a projection region at a position closer to the center side, for example, by ten and several millimeters from a peripheral edge of the wafer W, to a position closer to the center side by several millimeters from a peripheral edge of the rear surface of the wafer W. The inner cup 40 is provided with a horizontal disk part 44 having an outer periphery composed of a lower edge of an inclined surface on an inner peripheral side of the protruding part 43. Further, the inner cup 40 has a structure in which the spin chuck 31 penetrates a central portion of the disk part 44.

The intermediate cup 50 is provided surrounding the outside of the inner cup 40. The bottom portion of the intermediate cup 50 is formed in a recessed shape with its central portion being recessed. A projecting portion at the outer periphery of the bottom portion of the intermediate cup 50 is structured as an annular solution receiving part 51. A waste solution path 52 is connected to the solution receiving part 51 from below, and exhaust pipes 53 as two exhaust paths are provided in a form entering the solution receiving part 51, at positions closer to the spin chuck 31 than the waste solution path 52. Side walls of the exhaust pipes 53 allow separation of air from liquid. The two exhaust pipes 53 merge together downstream and are connected, for example, to an exhaust duct of a plant via a damper 54 as an exhaust rate switching mechanism. The exhaust pipes 53 can suck and exhaust the atmosphere in the treatment cup 33 at an exhaust rate at one of two stages such as a high exhaust and a low exhaust by the opening/closing degree of the damper 54. Note that though described in the section of Background of the Invention, the high exhaust means a state in which the exhaust pressure is high and the exhaust rate is high and the low exhaust means a state in which the exhaust pressure is low and the exhaust rate is low.

Figure 3:
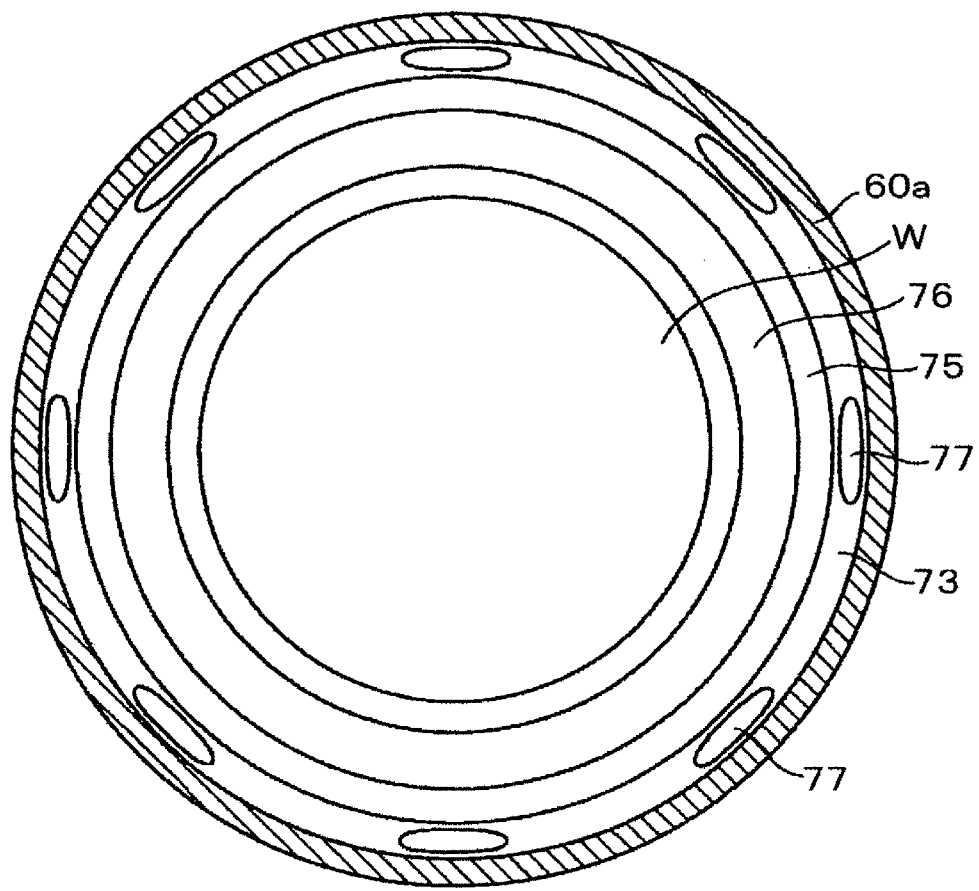
FIG. 3 is a top view of the treatment cup.

Further, the intermediate cup 50 has a cylindrical part 50a which is vertically disposed. A lower edge of an upper guide part 70 generally obliquely extending upward to the inside from an upper edge of the cylindrical part 50a, that is, the upper edge of the cylindrical part 50a is located slightly higher than a lower edge of the lower guide part 45. Further, an upper end surface of the upper guide part 70 is set at substantially the same height position as a front surface of the wafer W held on the spin chuck 31. The upper end surface of the upper guide part 70 is formed as an annular horizontal surface 76 having an inner edge separated from the peripheral edge of the wafer W, for example, by 2 mm and having a width (a length dimension along an extended line of the diameter of the wafer W) of, for example, 304 mm. A surface (an outer peripheral surface) continuous from an outer edge of the horizontal surface 76 of the upper guide part 70 is formed as an inclined surface 75, a vertical surface 74, and an inclined surface 73 in order from the top. In the lower inclined surface 73, a plurality of openings 77 are formed along the circumferential direction of the wafer W as shown also in FIG. 3.

On the other hand, an inner peripheral surface of the upper guide part 70 is annularly formed opposed to the lower guide part 45, in a manner to surround an outside lower region of the wafer W held on the spin chuck 31 as shown in FIG. 1. The upper guide part 70 has an inner peripheral surface having a longitudinal-sectional shape composed of a curved surface 72 curved to bulge outward and an inclined surface 71 extending downward from the curved surface 72. Between the upper guide part 70 and the inclined wall 41, an annular flow path 79 is formed as a lower annular flow path obliquely extending to the outside. Also between the cylindrical part 50a and the vertical wall 42, the annular flow path 79 which vertically extends will be formed.

The outer cup 60 is composed of a cylindrical part 60a extending out upward from an upper end portion of the cylindrical part 50a of the intermediate cup 50, and an inclined wall 61 extending out upward to the inside from an upper edge of the cylindrical part 60a. An annular space 78 as an upper annular flow path between the outer cup 60 and the upper guide part 70 has a function to reduce the turbulence of a gas flow formed by rotation of the wafer W when the resist solution is spread over the wafer W. A shortest distance L between the inclined wall 61 and the horizontal surface 76 of the upper guide part 70 has been set, for example, at 10 mm in order to increase the flow speed of a later-described descending gas flow. Further, a numeral 62 in the drawing denotes an opening. Through this opening 62, the wafer W is delivered to/from the spin chuck 31.

Figure 4A:
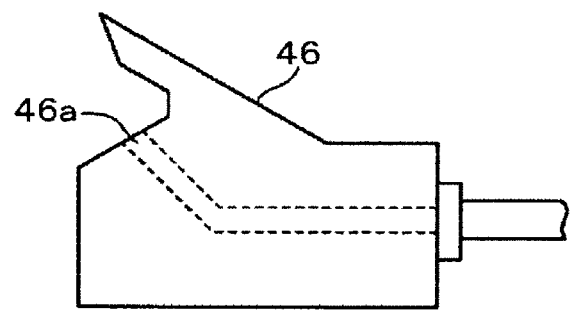
FIG. 4A is a side view of a bevel cleaning nozzle used in the resist coating apparatus.
Figure 4B:
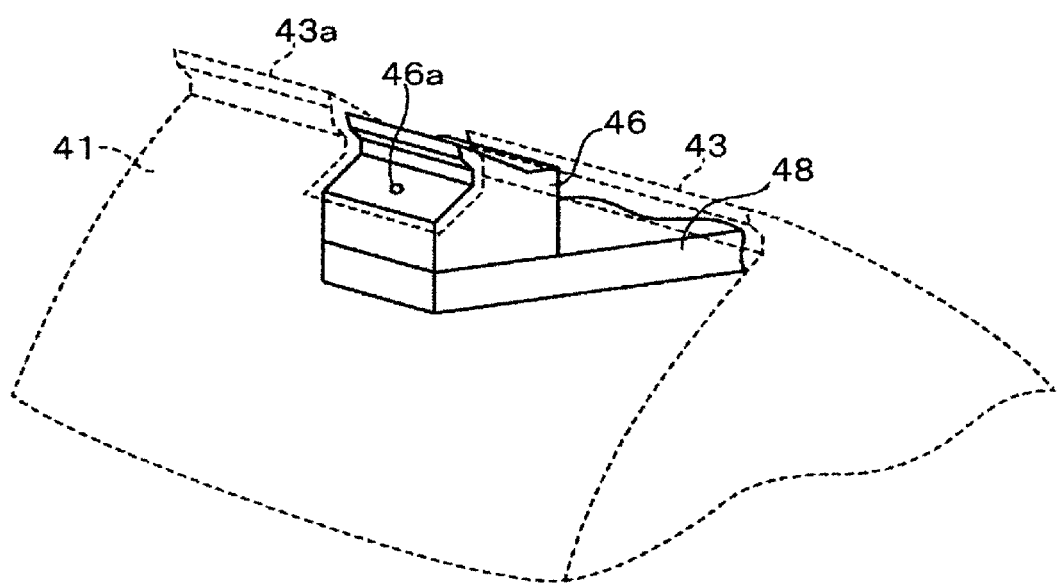
FIG. 4B is a perspective view of the bevel cleaning nozzle.
Figure 5:
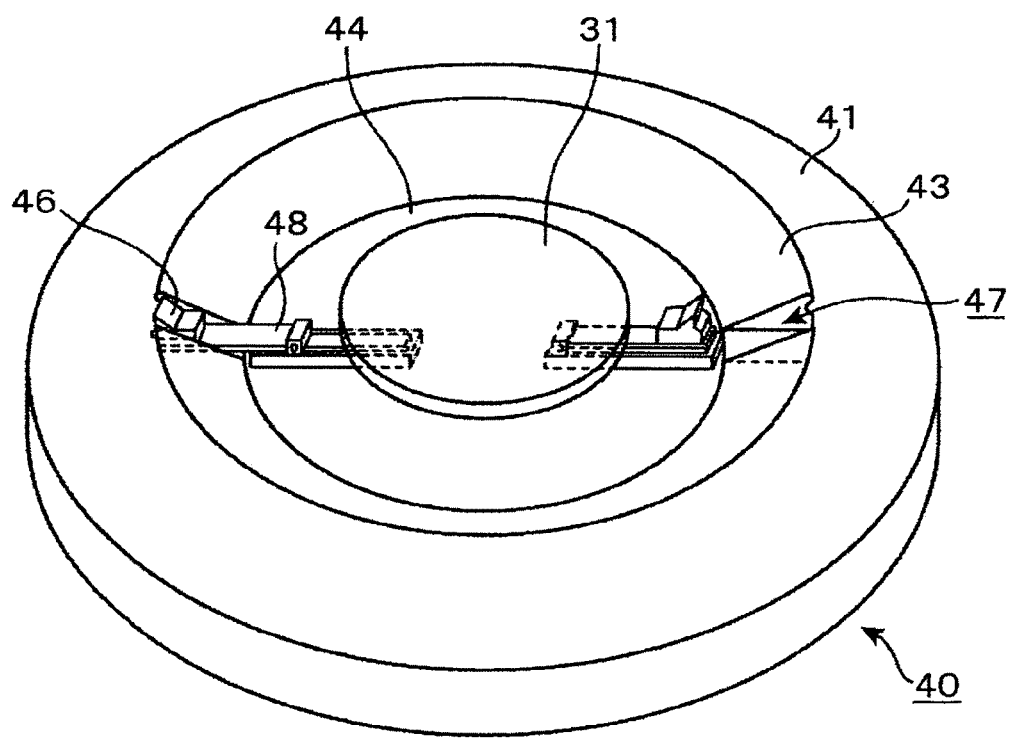
FIG. 5 is a perspective view showing the relation between an inner cup and the bevel cleaning nozzle used in the resist coating apparatus.

Next, a bevel cleaning nozzle 46 will be described. As shown in FIG. 4B and FIG. 5, the bevel cleaning nozzle 46 is fitted in a cutout part 47 made by cutting a portion of the annular inclined wall 43 of the inner cup 40, and two bevel cleaning nozzles 46 are provided opposite each other in the diameter direction of the disk part 44. The bevel cleaning nozzle 46 can move back and forth between the spin chuck 31 side and the inclined wall 43 side, along a rail 48 extending in the diameter direction of the disk part 44. Further, as shown in FIG. 4A, the bevel cleaning nozzle 46 has a discharge port 46a for discharging the cleaning solution for cleaning a bevel portion of the wafer W. The discharge port 46a is formed to face the peripheral edge portion of the rear surface of the wafer W in a state in which the bevel cleaning nozzle 46 is fitted in the cutout part 47. The discharge port 46a can receive supply of the cleaning solution from a not-shown cleaning solution supply source connected to the bevel cleaning nozzle 46 via a pipe, and discharge the cleaning solution to the wafer W.

The treatment cup 33 is accommodated in a casing 80 as shown in FIG. 1. A side wall of the casing 80 is provided with a carry in/out port 81 for carrying in/out the wafer W via a not-shown carrier arm. A numeral 82 in the drawing denotes a shutter for opening/closing the carry in/out port. This shutter 82 is closed except when the wafer W is carried in/out to/from the inside of the casing 80 by the carrier arm. In an upper portion in the casing 80, a fan filter unit (FFU) 83 is provided. This FFU 83 has a function to supply clean gas, for example, clean air into the casing 80 from above via a pipe 84 to form a descending gas flow. Further, an exhaust pipe 85 for sucking and exhausting the atmosphere in the casing 80 is provided at a bottom portion of the casing 80. The descending gas flow from the FFU 83 cooperates with the exhaust by suction by the exhaust pipe 85 form the descending gas flow in the casing 80.

In the casing 80, a solvent nozzle 91 which discharges a solvent, for example, a thinner and a resist nozzle 92 which discharges a resist solution are provided above the treatment cup 33. These nozzles 91 and 92 are connected to a solvent supply source 95 and a resist supply source 96 via supply pipes 93 and 94 respectively, and are configured to be movable by a not-shown carrier arm between a predetermined position above the wafer W and a waiting position beside the treatment cup 33. Note that the nozzles 91 and 92 may employ a configuration that they are, for example, united and moved by a common moving mechanism.

A numeral 90 in the drawing denotes a control unit. The control unit 90 conducts drive control of the rotation drive unit 32 and switching control of the damper 54. The control unit 90 is composed of a computer including, for example, a central processing unit (CPU) and a program operating the resist coating apparatus. In this program, a step (command) group and the like on the control relating to the supply timing and the supply rate of the resist solution, the rotation speed and the rotation time of the spin chuck 31, the supply timing and the supply rate of the cleaning solution and so on are set based on a predetermined schedule. This program is stored, for example, in a hard disk, a compact disk, a magneto-optical disk, a memory card or the like and installed to the computer.

Next, the operation of the above-described embodiment will be described. The not-shown carrier arm is used to carry the wafer W into the casing 80 through the carry in/out port 81. The rotation drive unit 32 raises the spin chuck 31, and the wafer W is mounted on the spin chuck 31 and vacuum-sucked on the spin chuck 31. Thereafter, the spin chuck 31 lowers to house the wafer W in the treatment cup 33. Note that, for example, three raising and lowering pins may be provided to penetrate the disk part 44 so that the wafer W is delivered to the spin chuck 31 by the raising and lowering operation of the raising and lowering pins. In this event, the above-described descending gas flow is formed in the treatment cup 33, and a part of the descending gas flow passes through the annular space 78 to the annular flow path 79 via the openings 77. Further, a part of the descending gas flow flows through the annular flow path 79 via the gap between the outer edge of the wafer W and the upper guide part 70, and is exhausted from the exhaust pipe 53. The annular space 78 has been set to have a shortest distance L of 10 mm between an outer side wall (the horizontal surface 76) of the upper guide part 70 and an inner wall of the inclined wall 61 of the outer cup 60, and the descending gas flow flows through the annular space 78 that is a narrow space and thereby flows downward through the openings 77 at an increased flow speed.

Figure 6:
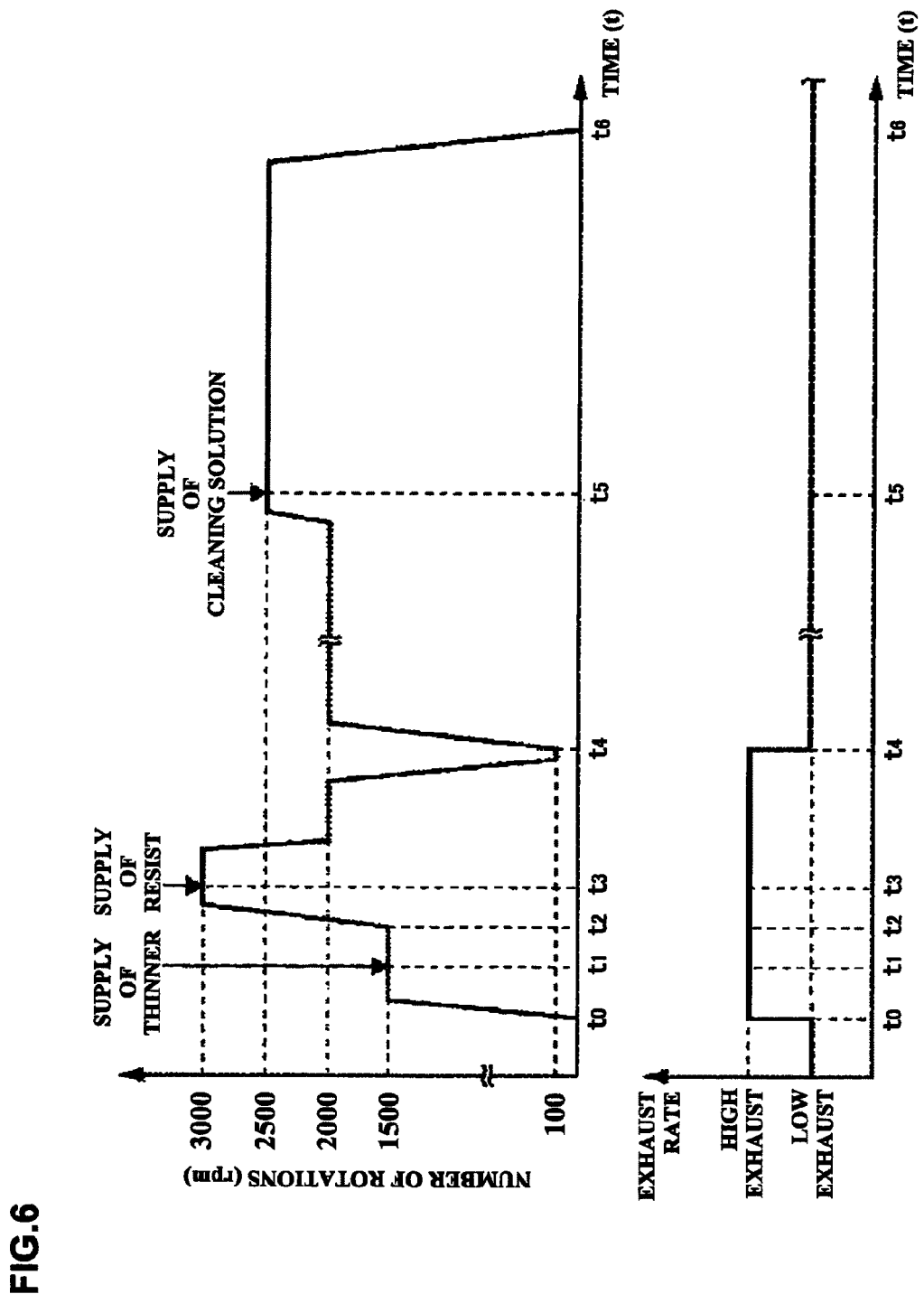
FIG. 6 is a relational diagram explaining a process of coating treatment in the resist coating apparatus.

Next, the spin chuck 31 rotates the wafer W at a number of rotations of, for example, 1500 rpm, and the damper 54 is set to a state of a high exhaust (a first state in which the exhaust rate is a first exhaust rate) to exhaust gas at the high exhaust (time $t_0$ in FIG. 6). This rotating wafer W generates gas flows. The generated gas flows flow through the annular space 78 inside the outer cup 60 and the annular flow path 79 inside the intermediate cup 50, then merge together via the openings 77, and are exhausted to the outside of the treatment cup 33 from the exhaust pipe 53 which is sucking gas at the high exhaust. Then, the solvent nozzle 91 is moved from the waiting position to a predetermined position above the wafer W using a not-shown moving mechanism. Then, the thinner is supplied from the solvent nozzle 91 to the wafer W (time $t_1$ in FIG. 6) to wet the front surface of the wafer W with the thinner, whereby pre-wetting is performed to create an environment in which a resist solution applied afterward easily spreads over the surface of the wafer W. Thereafter, the solvent nozzle 91 is retreated to the waiting position, and the resist nozzle 92 is moved to a predetermined position above the wafer W.

Figure 7:
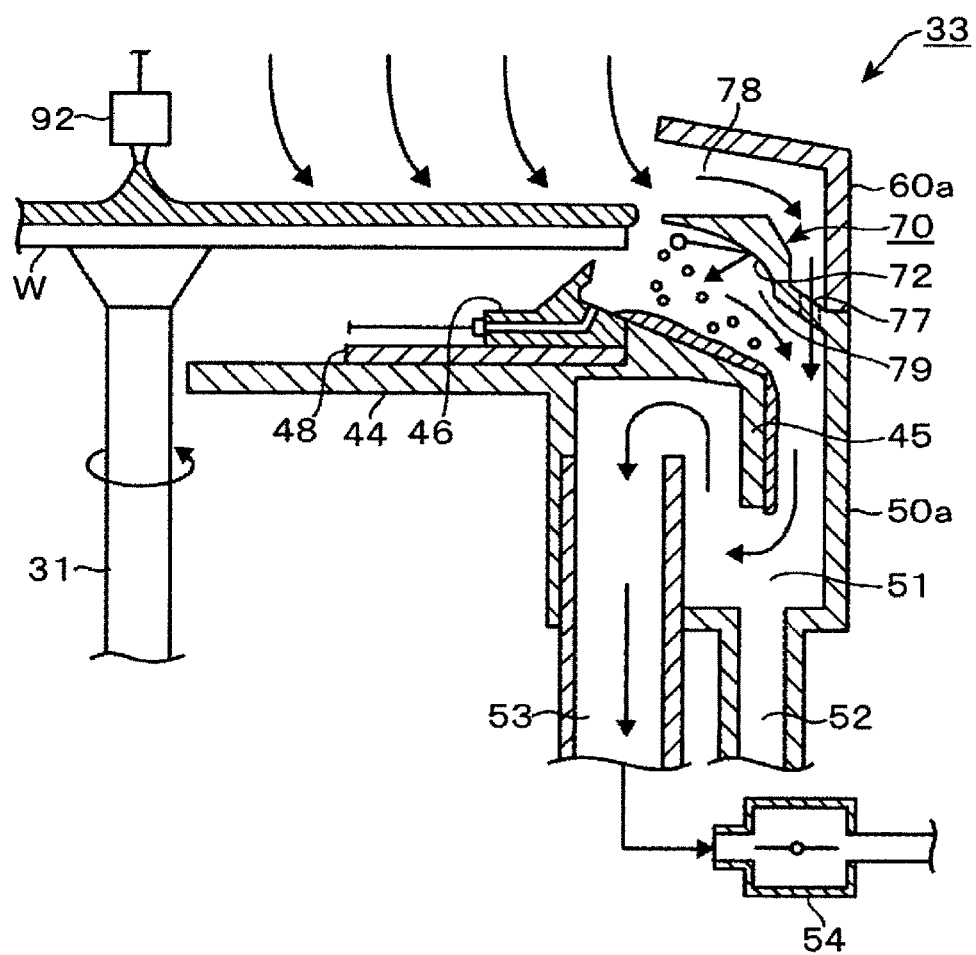
FIG. 7 is a schematic view schematically explaining an appearance of resist coating using the resist coating apparatus.

Then, in the state in which the damper 54 is continuously set at the state of the high exhaust, the number of rotations of the wafer W is increased to, for example, 3000 rpm (time $t_2$ in FIG. 6). Subsequently, the resist solution is discharged from the resist nozzle 92 to a center portion of the wafer W (time $t_3$ in FIG. 6). As shown in FIG. 7, the resist solution is spread out from the center portion to the peripheral edge portion by the centrifugal force by the rotation of the wafer W, and excessive resist solution is spun off from the front surface of the wafer W. The spun-off resist solution immediately after the discharge of the resist solution scatters in the annular flow path 79 and flows down the surface of the lower guide part 45, is temporarily stored in the solution receiving part 51 and drained to the outside of the treatment cup 33 from the waste solution path 52. Further, the resist which has become mist flows on the above-described descending gas flow through the annular flow path 79 inside the intermediate cup 50, and is exhausted to the outside of the treatment cup 33 from the exhaust pipe 53. At the time of resist coating, the mist of the resist spun off from the wafer W bumps into the curved surface 72 but hardly bounces to the wafer W because the curved surface 72 is curved to bulge outward from the wafer W. After completion of the coating treatment of the resist solution, the resist nozzle 92 is retreated to the predetermined waiting position, and the number of rotations of the wafer W is decreased, for example, to 2000 rpm and the wafer W is rotated, for example, for one second.

Figure 8:
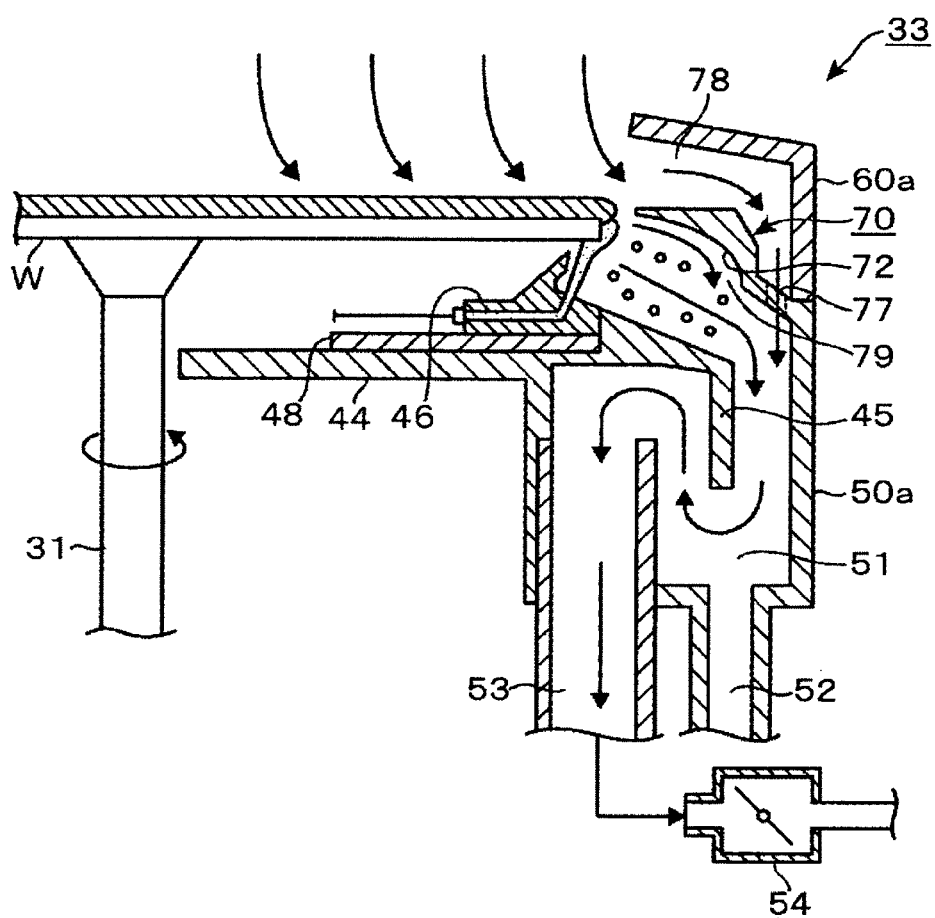
FIG. 8 is a schematic view schematically explaining an appearance of bevel cleaning treatment in the resist coating apparatus.

Then, the damper 54 is switched to a state of a low exhaust (a second state in which the exhaust rate is a second exhaust rate lower than the first exhaust rate), and the number of rotations of the wafer W is once decreased down, for example, to 100 rpm to secure the flatness of the solution film of the resist. Thereafter, the number of rotations is increased, for example, to 2000 rpm (time $t_4$ in FIG. 6) to adjust the resist film thickness and dry the resist for a predetermined time, for example, about 15 seconds to thereby form a resist film. Thereafter, the number of rotations of the wafer W is set at 400 rpm to 2500 rpm, for example, 2500 rpm in this embodiment, and the solvent that is the cleaning solution is discharged from the bevel cleaning nozzles 46 to the bevel portion at the peripheral edge of the wafer W (time $t_5$ in FIG. 6). The discharge of the cleaning solution is performed, for example, for 5 seconds. As shown in FIG. 8, the cleaning solution flows from the bevel portion on the rear surface side of the wafer W to the bevel portion on the front surface side to clean (cut) the peripheral edge portion of the resist solution film in a predetermined width.

In the bevel cleaning process, since the number of rotations of the wafer W is, for example, 2500 rpm, the speed of the gas flow generated by the rotation of the wafer W is high (the gas flow has momentum). However, as shown in FIG. 8, the gas flow is decreased in flow speed in the annular flow path 79 which has an increased volume, and merges with the descending gas flows passed through the openings 77, so that the atmosphere in the treatment cup 33 is sucked and exhausted to the outside of the treatment cup 33 from the exhaust pipe 53 though the atmosphere is being exhausted at a low exhaust. Then, the wafer W is continuously rotated to dry the cleaning solution, for example, for 5 seconds, and then the rotation is stopped and the atmosphere is continuously sucked in the low exhaust state (time $t_6$ in FIG. 6). Thereafter, the wafer W is delivered to the carrier arm in a course reverse to that at the carry-in of the above-described wafer W and carried out of the resist coating apparatus. Note that the shape of the annular flow path 79 does not correspond to that in FIG. 1, for convenience to clearly explain its operation.

According to the embodiment of the present invention described above, a part of the inner side wall of the upper guide part 70 is formed as the curved surface 72 which is made to bulge outward to depart from the wafer W held on the spin chuck 31, and the volume of the annular flow path 79 divided by the inner side wall of the upper guide part 70 and the surface of the lower guide part 45 is increased, whereby the momentum (speed) of the gas flow generated by the rotated wafer W is relaxed in the annular flow path 79. Therefore, even in a state where the wafer W is rotated at a high speed and the exhaust rate from the treatment cup 33 is the low exhaust at the time of cleaning the bevel, the phenomenon that air inversely flows through the openings 77 can be restrained. Consequently, it becomes possible to decrease the quantity of mist of the cleaning solution scattering on the gas flow to the outside from the opening 62 of the treatment cup 33, thereby preventing the mist from adhering again to the front surface of the wafer W on which the resist film has already been formed. Further, since the curved surface 72 of the upper guide part 70 is curved to bulge outward, the solution spun off from the wafer W can be prevented from bouncing to the wafer W. Further, the shortest distance L between the horizontal surface 76 of the upper guide part 70 and the inclined wall 61 of the outer cup 60 is set to, for example, 10 mm to be narrower so as to increase the flow speed of the descending gas flow, thereby making it possible to press downward the air which inversely flows upward from below through the openings 77. Accordingly, the above-described effects can be enhanced.

Figure 9:
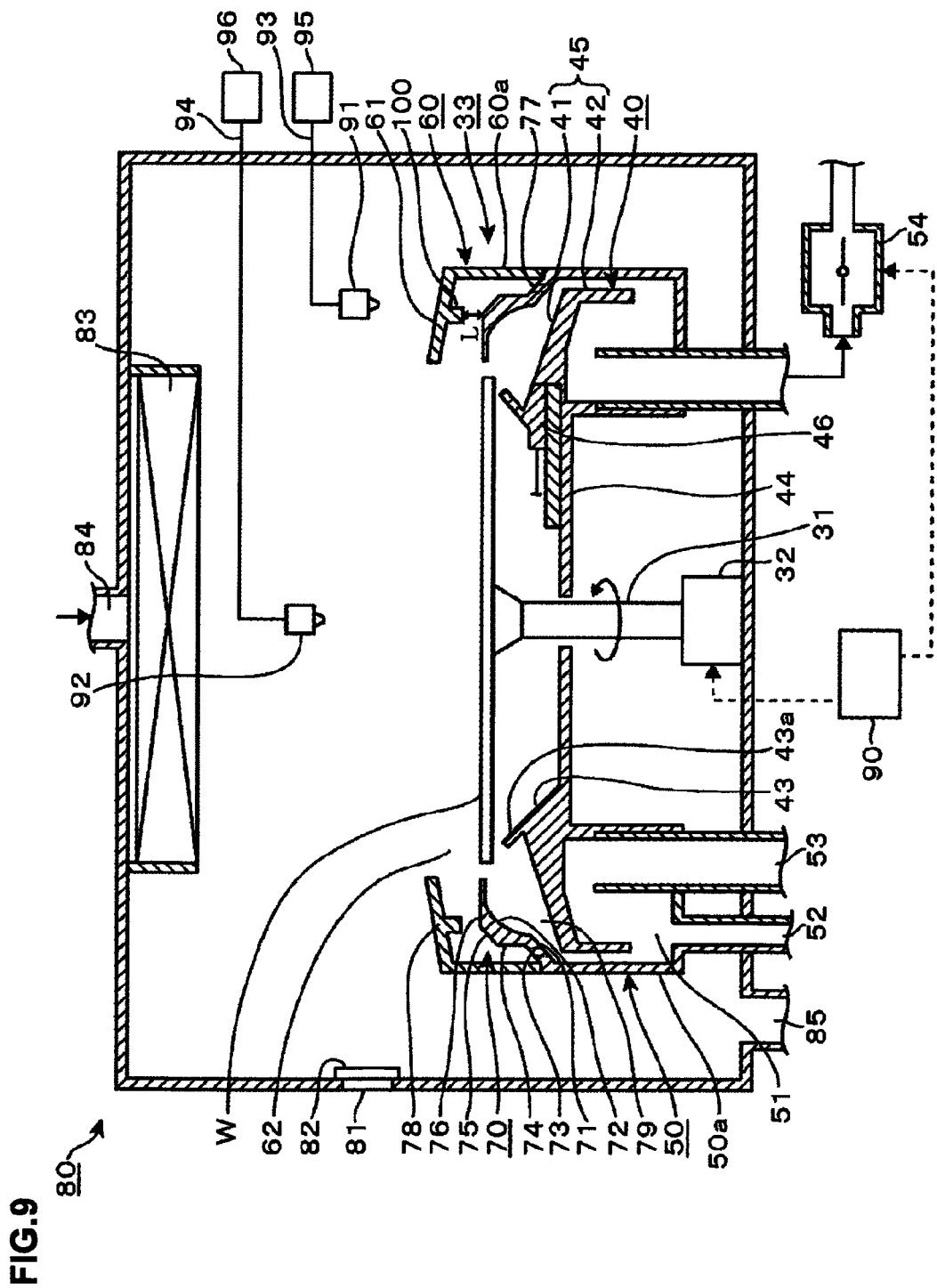
FIG. 9 is a longitudinal sectional view of a resist coating apparatus according to another embodiment.
Figure 10:
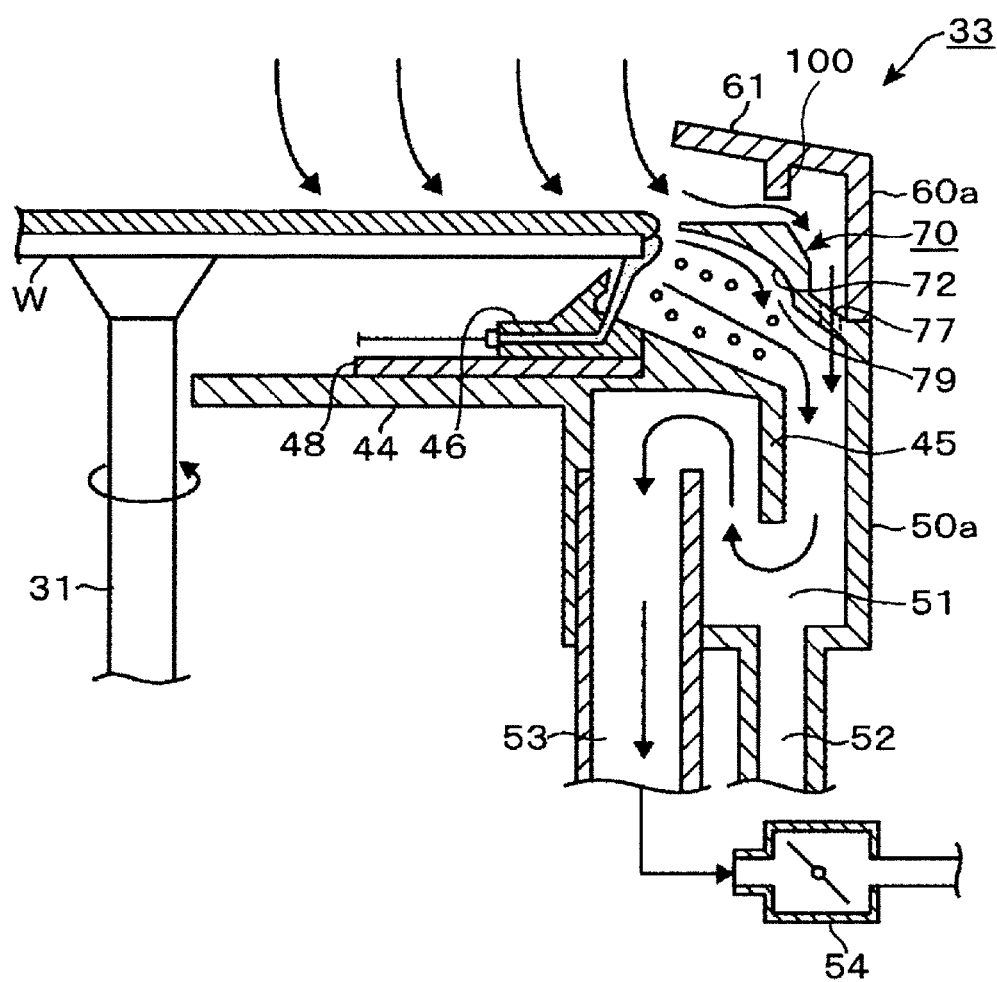
FIG. 10 is a schematic view schematically explaining an appearance of the bevel cleaning treatment in a resist coating apparatus according to another embodiment.

Next, another embodiment of the resist coating apparatus according to the present invention will be described. The same numerals are given to the same structure and portion as those in the above embodiment, and a different portion will be mainly described. In this example, as shown in FIG. 9, an annular vertical wall 100 formed over the whole circumference is provided at a bottom surface of the inclined wall 61 of the outer cup 60. The vertical wall 100 vertically extends toward the horizontal surface 76 of the upper guide part 70, and the distance between a lower end surface of the vertical wall 100 and the horizontal surface 76 is set at 5 mm. By providing the vertical wall 100 as described above, air supplied from the FFU 83 passes through the narrow gap between the lower end surface of the vertical wall 100 and the horizontal surface 76 and thereby increases in flow speed, and flows downward through the openings 77. This makes it possible to more strongly restrain the air which tends to inversely flow upward from below through the openings 77. Accordingly, the above-described effects can be enhanced more.

Figure 11:
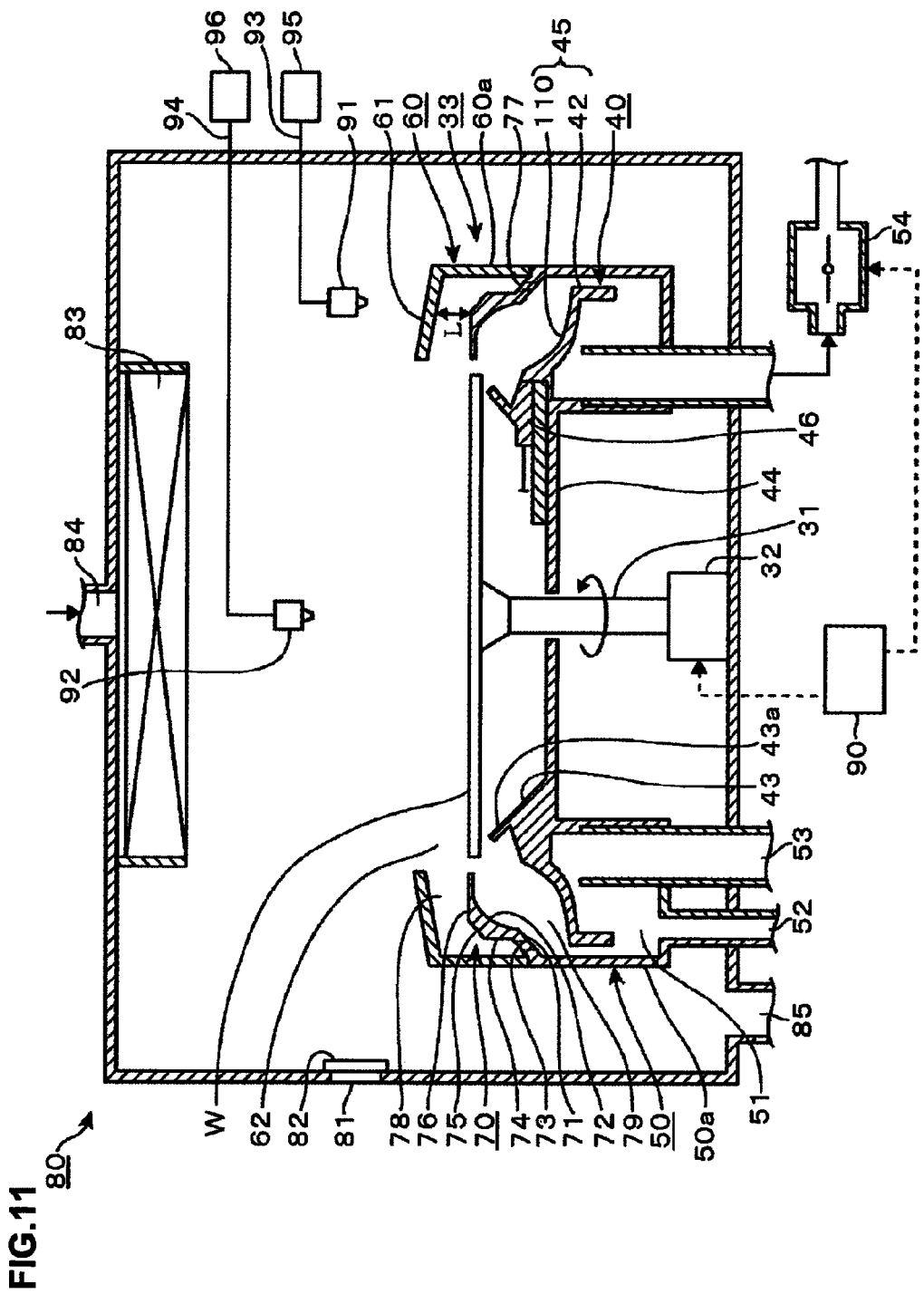
FIG. 11 is a longitudinal sectional view of a resist coating apparatus according to another embodiment.
Figure 12:
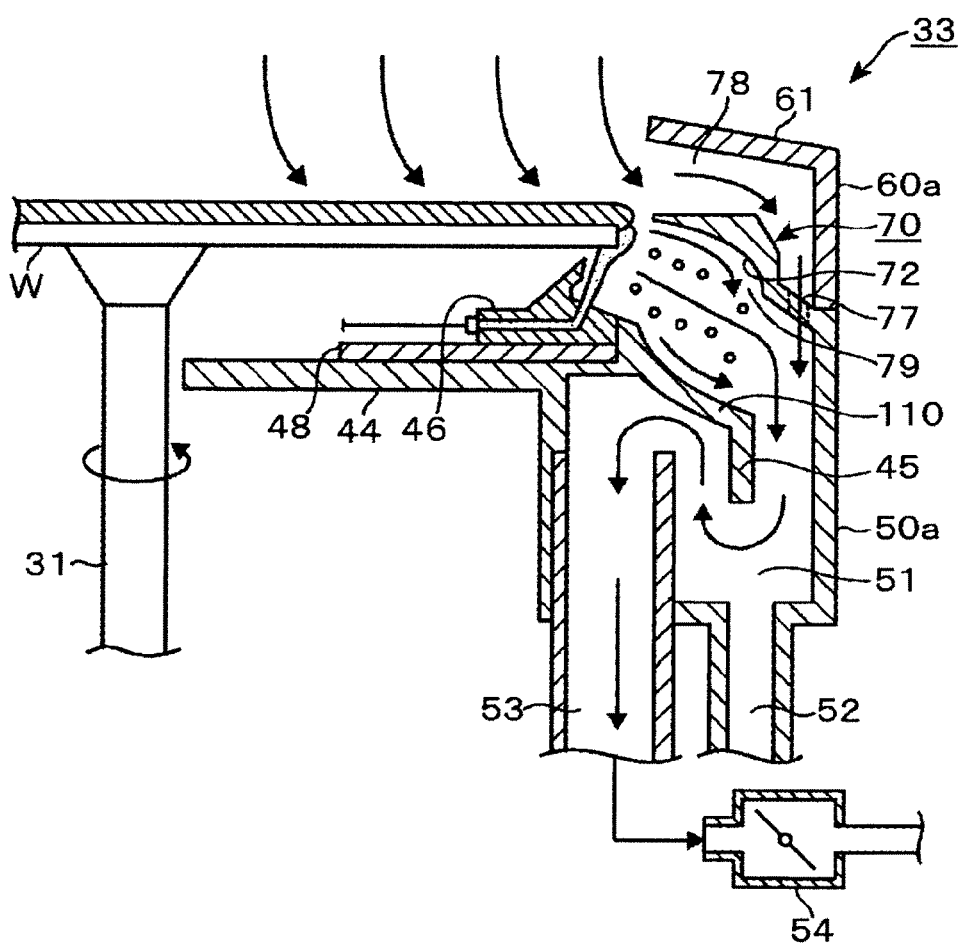
FIG. 12 is a schematic view schematically explaining an appearance of the bevel cleaning treatment in the resist coating apparatus according to another embodiment.

Further, the resist coating apparatus according to the present invention may take an embodiment shown in FIG. 11. The same numerals are given to the same structure and portion as those in the above embodiments, and a different portion will be mainly described. In this embodiment, an annular curved wall 110 which is curved downward is used in place of the above-described inclined wall 41. A vertical wall 42 is provided continuously from the curved wall 110 so that the curved wall 110 and the vertical wall 42 constitute the lower guide part 45. By curving a portion of the lower guide part 45 as described above, the volume of the annular flow path 79 is increased as compared to those of the above-described embodiments, so that the flow speed of the gas flow generated by the rotating wafer W is relaxed more (see FIG. 12). Accordingly, the effects of the above-described embodiments can be enhanced more.

As described above, in the present invention, the number of rotations when treating the substrate with a treatment solution (the bevel cleaning treatment with the solvent in the above-described example) even at the lower exhaust can be increased by making the annular flow path 79 inside the intermediate cup 50 in a bulging shape. Such effect is not limited to the time when performing the bevel cleaning. This means that application of an anti-reflection film or a resist protection film for coping with liquid-immersion exposure, on the wafer W, the cleaning with pure water after the exposed wafer W is developed with a developing solution, or the cleaning of the wafer W with a cleaning solution such as pure water before or after liquid-immersion exposure can be performed while the wafer W is being rotated, at a lower exhaust than before to prevent the reverse flow of mist. Though the openings 77 for allowing the solution scattering in the outer cup 60 to flow downward are provided in the resist coating apparatus, the present invention is effective also in the case of a solution treatment apparatus in which the outer cup 60 is not provided. More specifically, the reason why the exhaust rate corresponding to the number of rotations of the wafer W is set in a sheet-type cleaning apparatus of the wafer W is that otherwise the mist reversely flows through the annular flow path 79 surrounding the wafer W causing a similar problem. Therefore, the reverse flow of the mist can be prevented by bulging the annular flow path 79 also in such an apparatus. In other words, there is an effect capable of reducing the exhaust rate.

Figure 13:
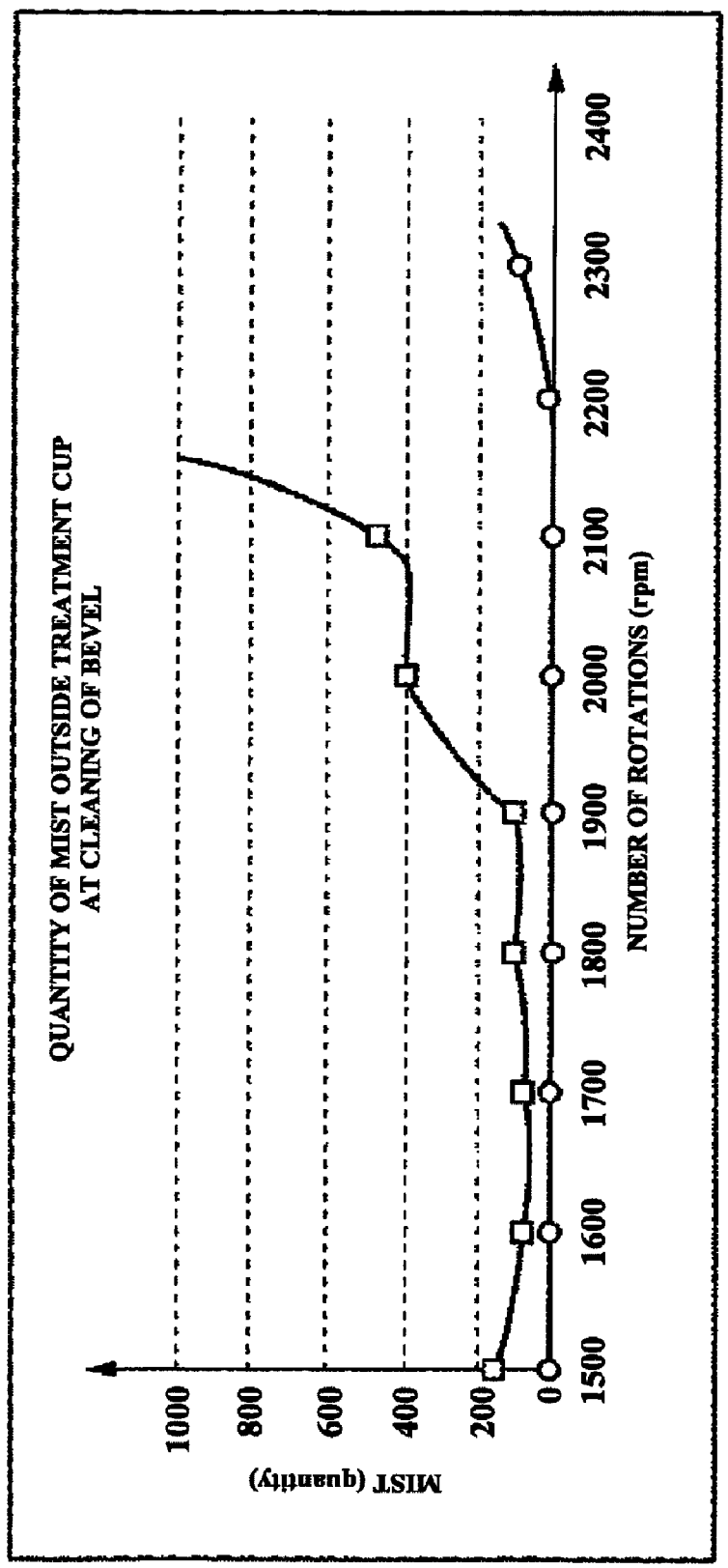
FIG. 13 is a comparative diagram of the quantities of mist scattering to the outside of the cups, comparing the treatment cup according to the embodiment of the present invention and the conventional treatment cup.
Figure 17:
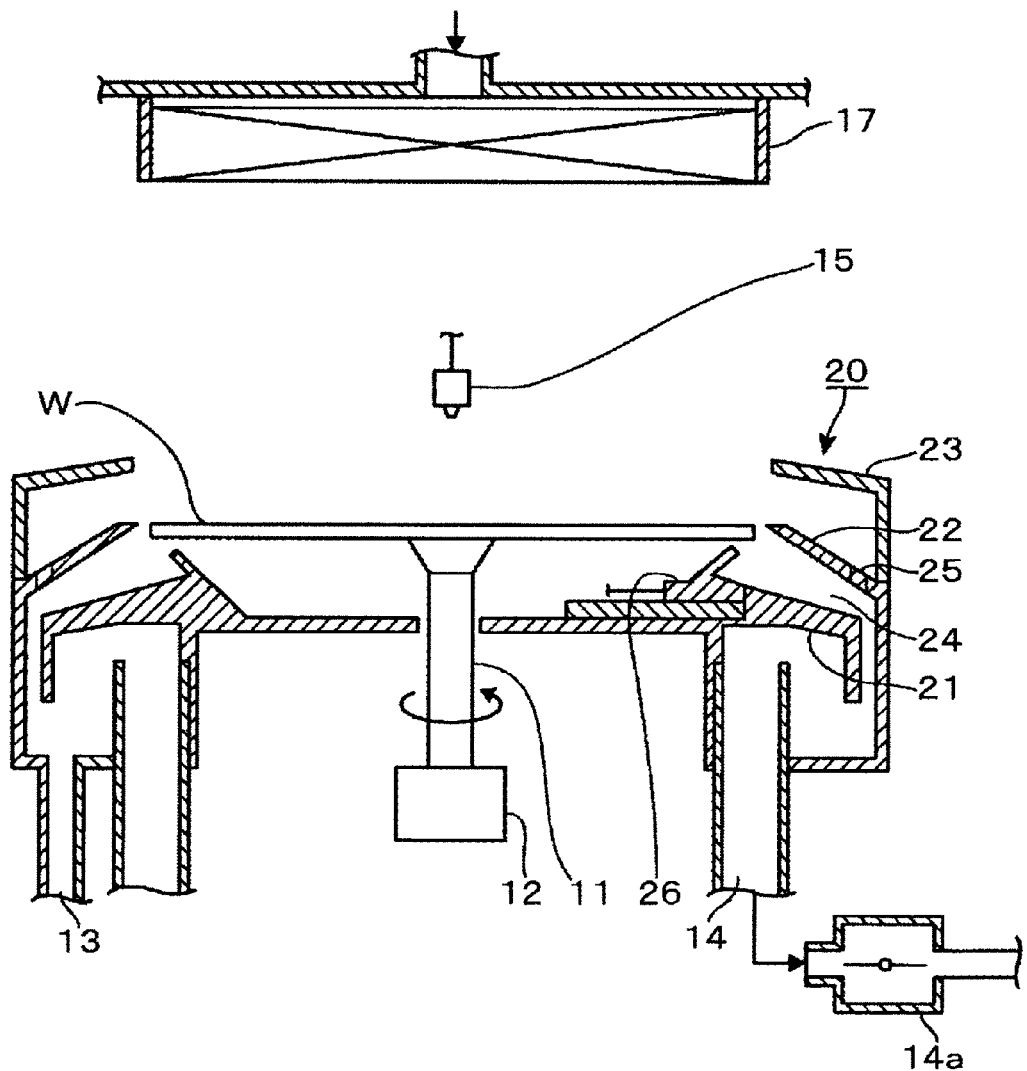
FIG. 17 is a longitudinal sectional view of a conventional resist coating apparatus.
Figure 18:
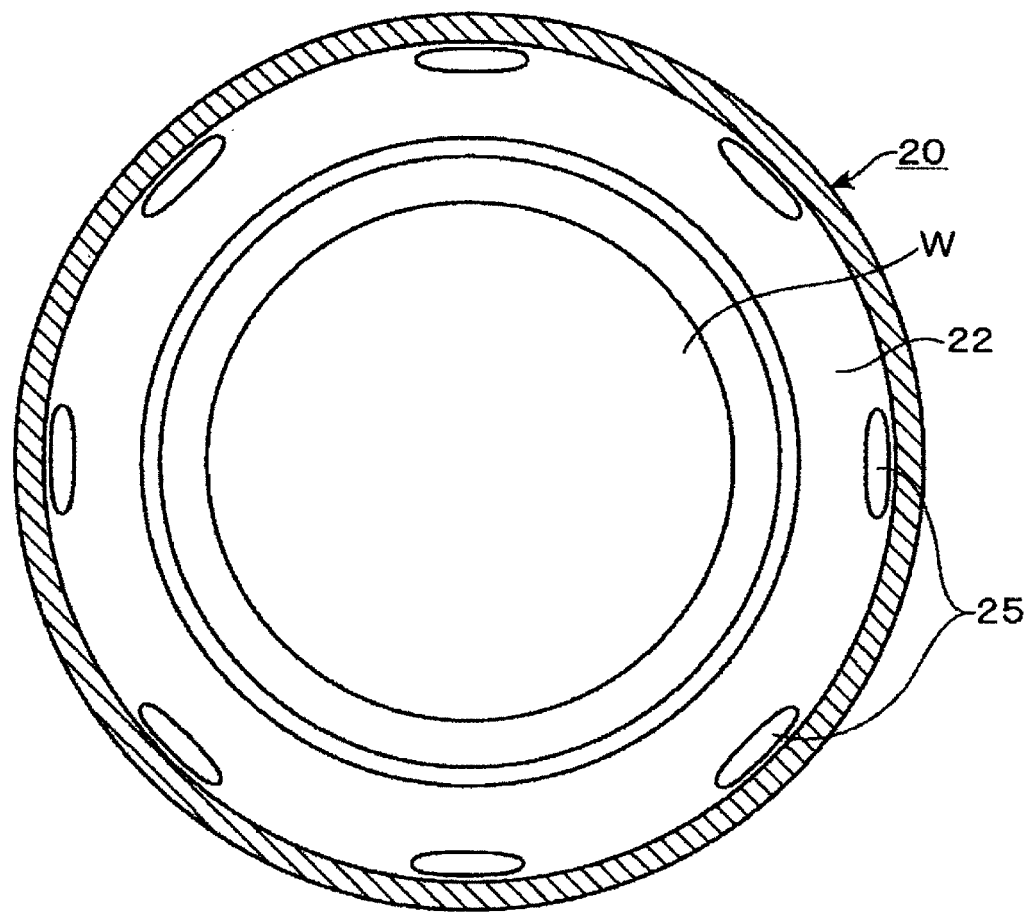
FIG. 18 is a top view of a treatment cup used in the conventional resist coating apparatus.
Figure 19:
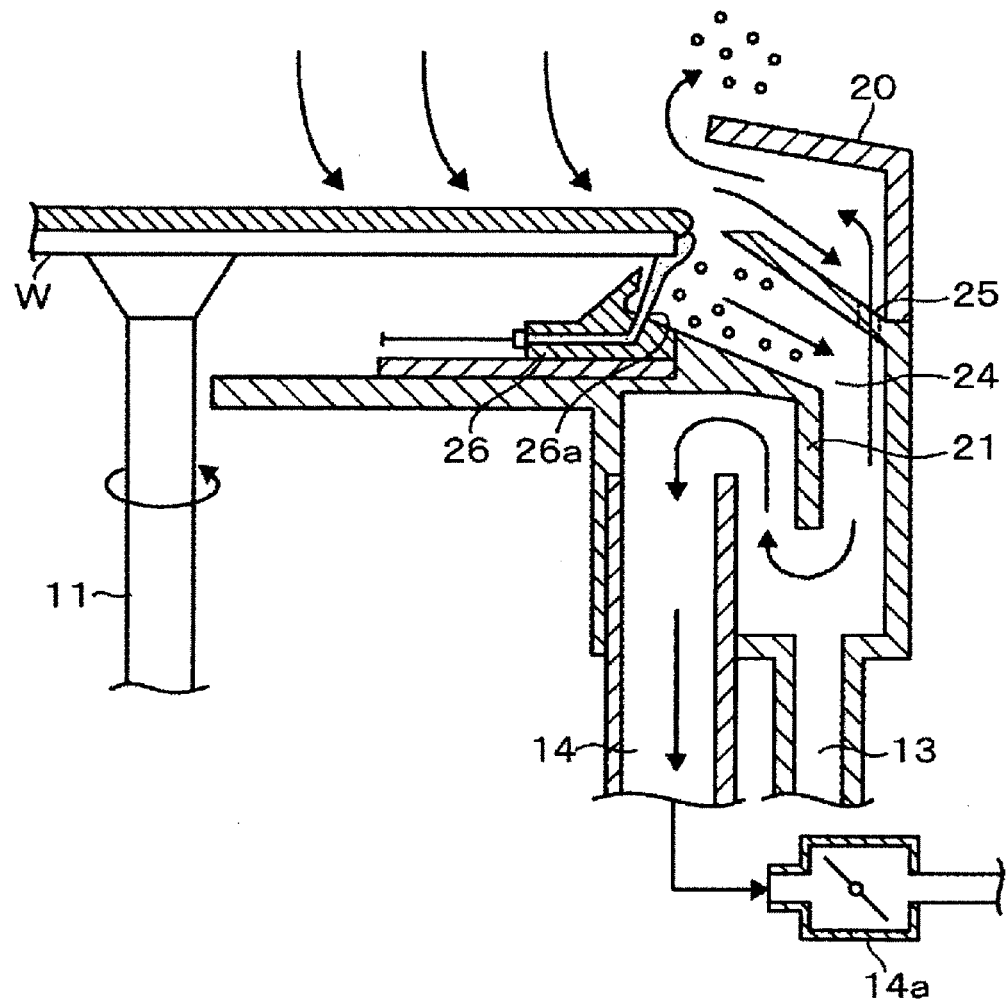
FIG. 19 is a schematic view schematically explaining an appearance of bevel cleaning treatment in the conventional resist coating apparatus.

Next, the mist quantities flowing to the outside of the treatment cup are compared between the conventional treatment cup and the treatment cup according to the embodiment of the present invention. The treatment cup 20 in FIG. 17 was used as the conventional treatment cup, and the treatment cup 33 in FIG. 1 was used as the treatment cup according to the embodiment of the present invention, and the exhaust rates of the treatment cups 20 and 33 were set to the same low exhaust. FIG. 13 is a graph showing the quantities of mist flowing to the outside of the treatment cups in the bevel cleaning process. The vertical axis shows the quantity (number) of mist flowing out, and the horizontal axis shows the number of rotations of the wafer W. Further, the plot of the conventional treatment cup 20 is a square (□), and the plot of the treatment cup 33 according to the embodiment of the present invention is a circle (○). It is found that with the conventional treatment cup 20, the quantity of mist is no more than 200, up to a number of rotations of 1500 rpm to 1900 rpm, but the quantity rapidly increases after 1900 rpm. On the other hand, it is found that with the treatment cup 33 in FIG. 1, the quantity of mist is no more than 200 between 1500 rpm and 2300 rpm. From the results, it is understood that the quantity of mist flowing to the outside of the treatment cup is less with the treatment cup 33 in FIG. 1 than the treatment cup 20 in FIG. 17.

Figure 14:
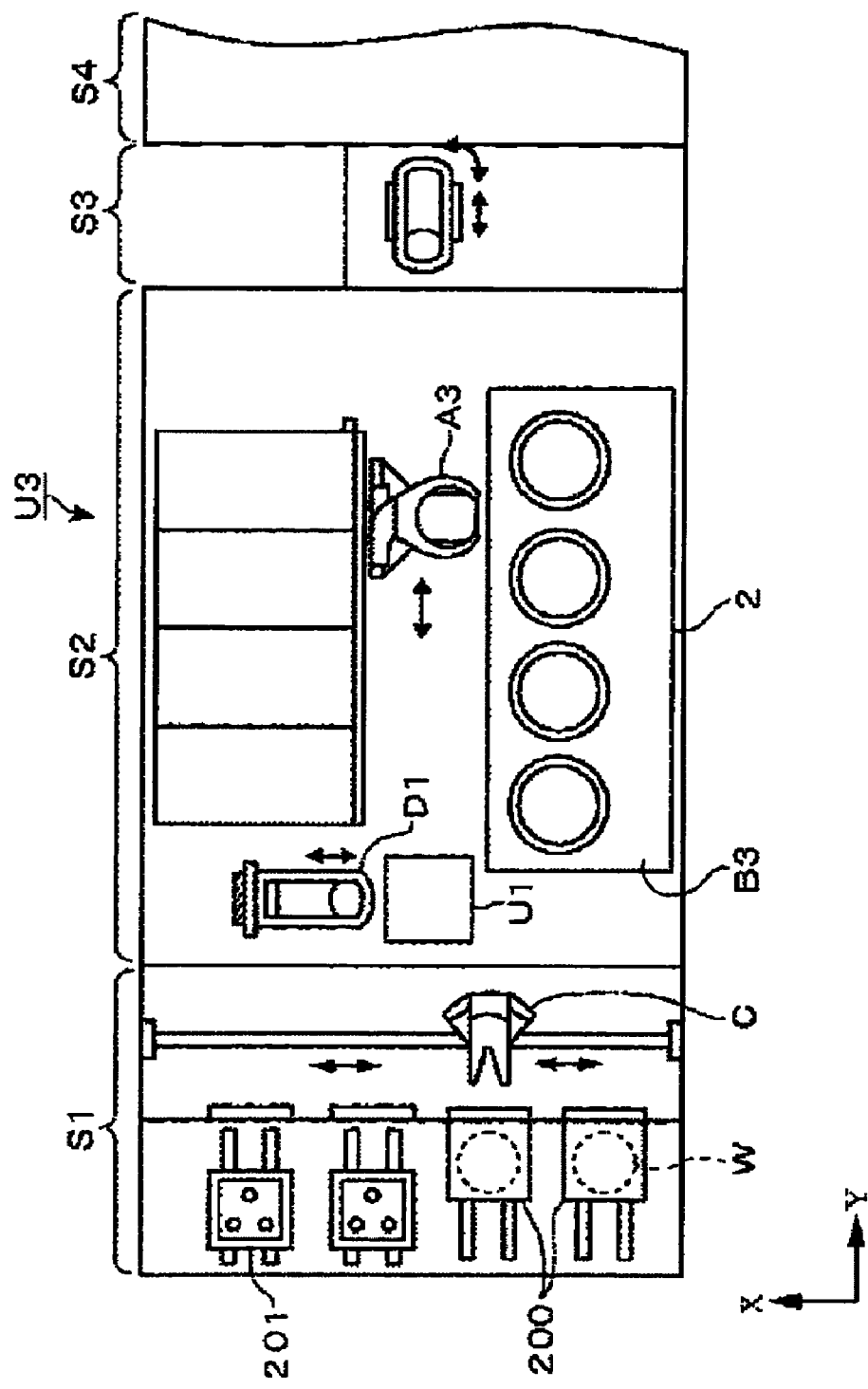
FIG. 14 is a plan view showing a coating and developing apparatus to which the resist coating apparatus according to the embodiment of the resent invention is applied.
Figure 15:
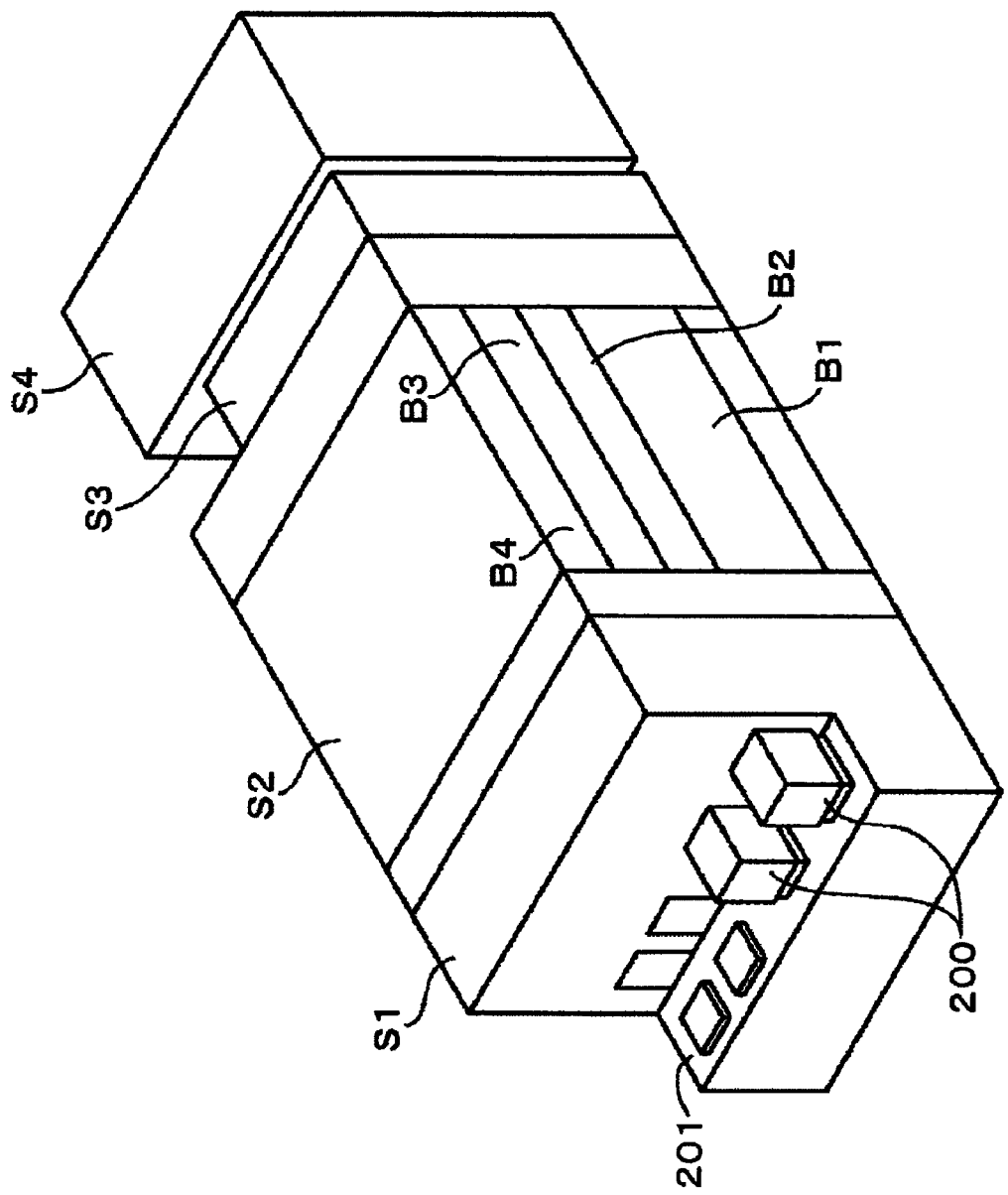
FIG. 15 is a perspective view of the coating and developing apparatus.

Subsequently, one example of a resist pattern forming system in which an aligner is connected to the coating and developing apparatus to which the above-described resist coating apparatus is applied will be briefly described. In the coating and developing apparatus, a carrier block S1 is provided as shown in FIG. 14 and FIG. 15. This carrier block S1 is configured such that a delivery arm C takes the wafer W out of a closed-type carrier 200 mounted on a mounting table 201, and delivers the wafer W to a treatment block S2 adjacent to the carrier block S1, and the delivery arm C receives a treated wafer W which has been treated in the treatment block S2, and returns the wafer W to the carrier 200.

Figure 16:
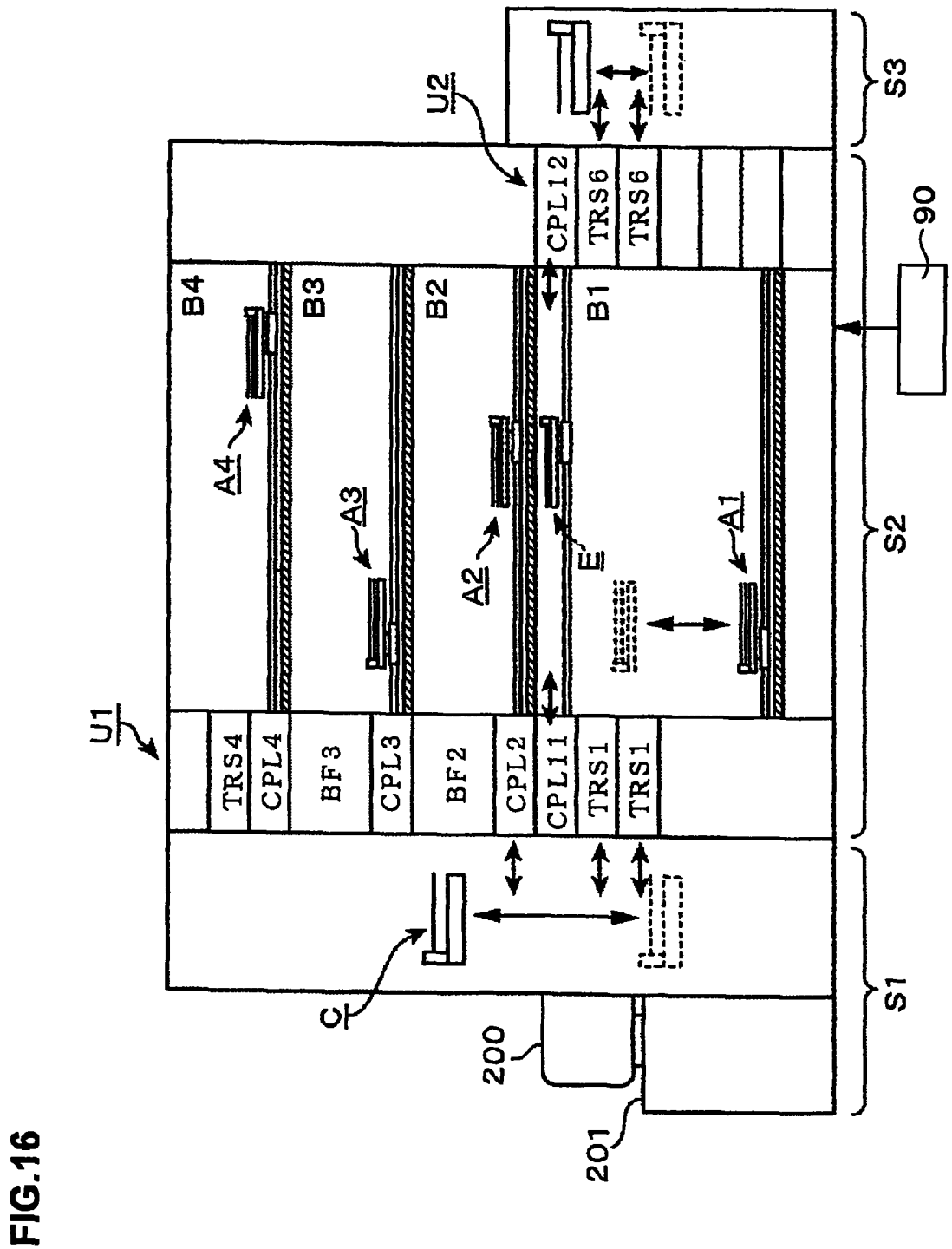
FIG. 16 is a longitudinal sectional view of the coating and developing apparatus.

The treatment block S2 is configured, as shown in FIG. 16, a first block (DEV layer) B1 for performing developing treatment, a second block (BCT layer) B2 for performing a forming treatment of an anti-reflection film to be formed on the lower side of the resist film, a third block (COT layer) B3 for performing coating treatment of the resist solution, and a fourth block (TCT layer) B4 for performing a forming treatment of an anti-reflection film to be formed on the upper side of the resist film, are stacked one on top of the other from the bottom in this embodiment.

The third block (COT layer) B3 includes the resist coating apparatus applying the resist solution, a treatment unit group of heating and cooling system incorporating a substrate heating apparatus for performing pre-processing and post-processing of the treatment performed in the resist coating apparatus, and a carrier arm A3 which is provided between the resist coating apparatus and the substrate heating apparatus and delivers the wafer W between them. Further, the second block (BCT layer) B2 and the fourth block (TCT layer) B4 each includes a solution treatment apparatus applying a chemical for forming an anti-reflection film by spin coating, a treatment unit group of the heating and cooling system, and a carrier arm A2 or A4 which is provided between the treatment apparatus and the treatment unit group and delivers the wafer W between them. On the other hand, in the first treatment block (DEV layer) B1, for example, developing units are two-tiered in one DEV layer B1. Further, in the DEV layer B1, a common carrier arm A1 for carrying the wafer W to the developing apparatuses at the two tiers is provided. Further, in the treatment block S2, a shelf unit U1 is provided as shown in FIG. 14 and FIG. 16. Between units in the shelf unit U1, the wafer W is carried by a delivery arm D1 which is provided near the shelf unit U1 and can lift up and down.

In such a coating and developing apparatus, the wafer W from the carrier block S1 is sequentially carried by the delivery arm C to one of transfer units in the shelf unit U1 for example, a corresponding transfer unit CPL 2 in the second block (BCT layer) B2. From CPL 2, the wafer W is carried into the third block (COT layer) B3 via a transfer unit CPL3 and the carrier arm A3, and the front surface of the wafer W is hydrophobized in a hydrophobic treatment unit, and then a resist film is formed in a solution treatment apparatus 2. The wafer W on which the resist film has been formed is delivered by the carrier arm A3 to a transfer unit BF3 in the shelf unit U1.

Thereafter, in this case, the wafer W is delivered to the carrier arm A4 via the transfer unit BF3, the delivery arm D1, and a transfer unit CPL4, and an anti-reflection film is formed on the resist film. Thereafter, the wafer W is delivered by the carrier arm A4 to a transfer unit TRS4. Note that the anti-reflection film is sometimes not formed on the resist film, and an anti-reflection film is sometimes formed in the second block (BCT layer) B2 in place of performance of hydrophobic treatment on the wafer W.

On the other hand, a shuttle arm E that is a dedicated carrier for directly carrying the wafer W from a transfer unit CPL 11 provided in the shelf unit U1 to a transfer unit CPL12 provided in the shelf unit U2 is provided in an upper portion in the DEV layer B1. The wafer W on which the resist film and the anti-reflection film have been formed is delivered by the delivery arm D1 to the transfer unit CPL11 via the transfer units BF3 and TRS4, and is directly delivered from the transfer unit CPL11 by the shuttle arm E to the transfer unit CPL12 in the shelf unit U2, and introduced into the interface block S3. Note that the transfer unit indexed by CPL in FIG. 16 also serves as a cooling unit for temperature regulation, and the transfer unit indexed by BF also serves as a buffer unit on which a plurality of wafers W can be mounted.

Subsequently, the wafer W is carried by an interface arm B to the aligner S4 and subjected to predetermined exposure processing therein, and then mounted on a transfer unit TRS6 in the shelf unit U2 and returned to the treatment block S2. The returned wafer W is subjected to developing treatment in the first block (DEV layer) B1, and carried by the carrier arm A1 to a transfer table in an access range of the delivery arm C in the shelf unit U1, and then returned to the carrier 200 via the delivery arm C.

What is claimed is:

1. A solution treatment apparatus performing solution treatment on a substrate while rotating the substrate held on a substrate holding unit in a treatment cup in which a descending gas flow is formed, and sucking and exhausting an atmosphere in said treatment cup and draining a solution in said treatment cup, from a lower portion of said treatment cup, said apparatus comprising:
    a nozzle for supplying a treatment solution to the substrate held on said substrate holding unit;
    a lower guide unit, including protruding wall part which extends obliquely upward from a projection region at a position closer to the center of the rear surface of the substrate to a peripheral edge of the rear surface of the substrate, the lower guide unit obliquely extending downward to an outside from a base of the protruding wall part at a position closely opposed to the peripheral edge portion of a rear surface of the substrate, the lower guide unit including the protruding wall part being formed in an annular shape in a circumferential direction of the substrate
    an upper guide unit which has an upper end surface located at a substantially same height as a front surface of the substrate held on said substrate holding unit, forms a lower annular flow path between said upper guide unit and said lower guide unit for guiding downward together with a gas flow a treatment solution scattering from the substrate, is formed in an annular shape opposed to said lower guide unit to surround an outside lower region of the substrate, and has an inner peripheral surface having a longitudinal-sectional shape curved to bulge outward and extending downward; and
    an outer guide unit which surrounds said upper guide unit is disposed from outside of said upper guide unit to above a side of said upper guide unit, and forms an upper annular flow path between said outer guide unit and said upper guide unit for rectifying a gas flow when said substrate is rotated;
    a projecting unit which projects from a lower surface of said outer guide towards said upper end surface of said upper guide unit so that said upper annular flow path is narrowed and is formed in an annular shape in a circumferential direction of said substrate; and
    an opening formed in a lower edge portion of said upper guide unit for merging a gas flow passed through said upper annular flow pathwith a gas flow passed through said lower annular flow path.

2. The solution treatment apparatus as set forth in claim 1, further comprising:
    an exhaust path for suction exhaust connected to said treatment cup; and
    an exhaust rate switching mechanism provided along said exhaust path for switching a suction exhaust rate between two stages which are a first state in which gas is exhausted at a first exhaust rate and a second state in which gas is exhausted at a second exhaust rate lower than the first exhaust rate.

3. The solution treatment apparatus as set forth in claim 1, wherein said nozzle includes a resist nozzle supplying a resist solution being the treatment solution to a center portion of the substrate, and a cleaning nozzle discharging a cleaning solution being the treatment solution to a bevel portion at a peripheral edge of the rear surface of the substrate, and
    wherein said solution treatment apparatus further comprises a control unit outputting a control signal for rotating the substrate and switching said exhaust rate switching mechanism to the second state, when the cleaning solution is discharged from said cleaning nozzle to the bevel portion.

4. The solution treatment apparatus as set forth in claim 3, wherein a number of rotations of the substrate when the cleaning solution is discharged from said cleaning nozzle to the beveled portion is 400 rpm to 2500 rpm.

* * * * *